(12) United States Patent
Jung et al.

(10) Patent No.: US 11,910,592 B2
(45) Date of Patent: Feb. 20, 2024

(54) CAPACITOR AND A DRAM DEVICE INCLUDING THE SAME

(71) Applicant: Samsung Electronics Co., Ltd., Suwon-si (KR)

(72) Inventors: Kyooho Jung, Seoul (KR); Dongkwan Baek, Seoul (KR); Cheoljin Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/702,190

(22) Filed: Mar. 23, 2022

(65) Prior Publication Data

US 2023/0005925 A1     Jan. 5, 2023

(30) Foreign Application Priority Data

Jul. 2, 2021     (KR) .................. 10-2021-0087102

(51) Int. Cl.
*H10B 12/00*     (2023.01)
(52) U.S. Cl.
CPC ......... *H10B 12/315* (2023.02); *H10B 12/033* (2023.02); *H10B 12/34* (2023.02)
(58) Field of Classification Search
CPC ...... H01L 28/40–92; H10B 12/02–056; H10B 12/30–488
See application file for complete search history.

(56) References Cited

U.S. PATENT DOCUMENTS

| | | |
|---|---|---|
| 7,835,134 B2 | 11/2010 | Kil et al. |
| 8,092,862 B2 | 1/2012 | Kil et al. |
| 8,288,810 B2 | 10/2012 | Arao |
| 8,993,044 B2 | 3/2015 | Krishnan et al. |
| 10,636,795 B2 | 4/2020 | Ahn et al. |
| 2021/0028010 A1 | 1/2021 | Kim et al. |
| 2022/0344451 A1* | 10/2022 | Beeler .................. H01L 28/90 |

FOREIGN PATENT DOCUMENTS

JP     2014044993 A     3/2014

* cited by examiner

*Primary Examiner* — Robert G Bachner
*Assistant Examiner* — Molly K Reida
(74) *Attorney, Agent, or Firm* — Myers Bigel, P.A.

(57) ABSTRACT

A capacitor may include a lower electrode, a dielectric layer structure on the lower electrode, and an upper electrode on the dielectric layer structure. The dielectric layer structure may include a plurality of dielectric layers and at least one insert layer structure between ones of the plurality of dielectric layers. The insert layer structure may include a plurality of zirconium oxide layers and at least one insert layer. The insert layer may be between ones of the plurality of zirconium oxide layers. The capacitor may have a high capacitance and low leakage currents.

16 Claims, 14 Drawing Sheets

FIG. 18
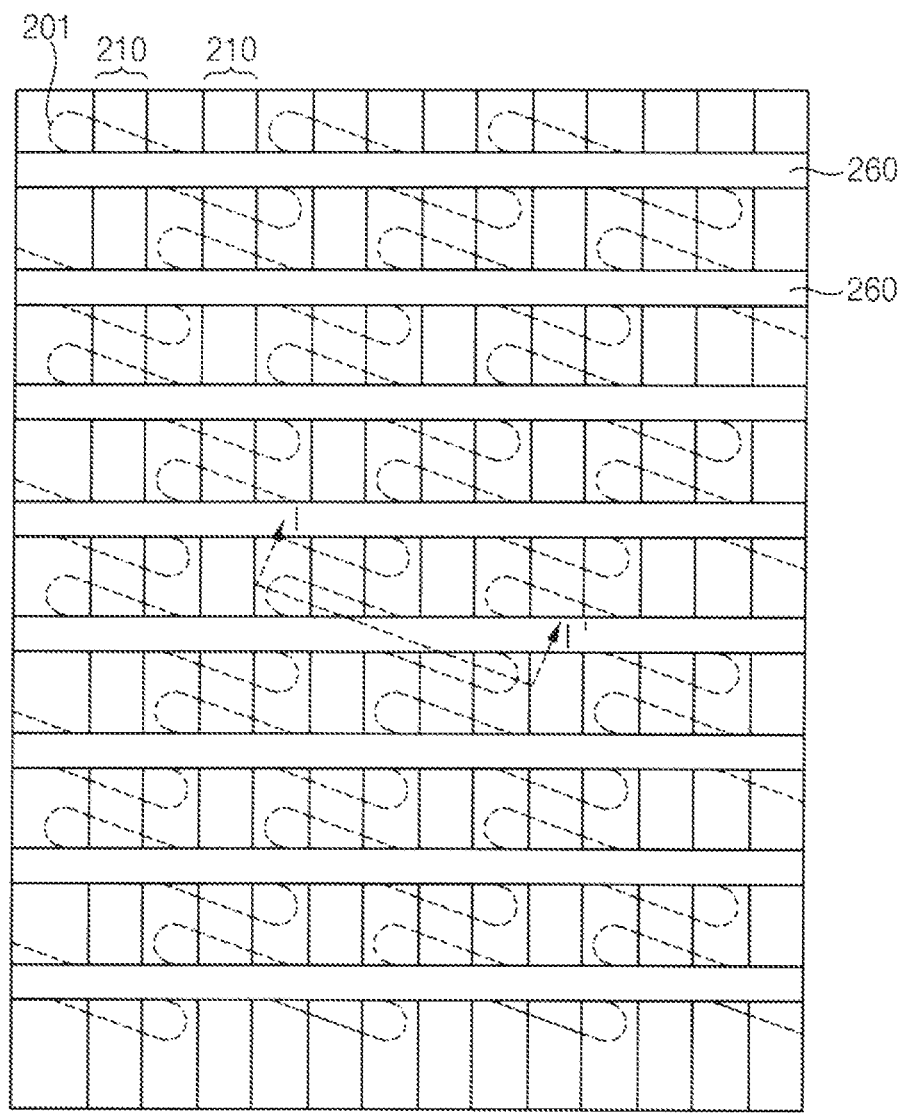
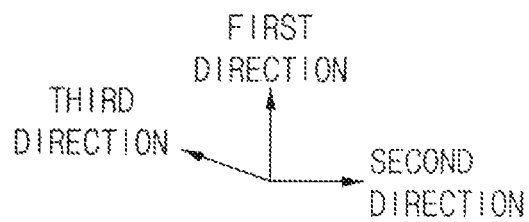

CAPACITOR AND A DRAM DEVICE INCLUDING THE SAME

CROSS-REFERENCE TO RELATED APPLICATION

This application claims priority under 35 USC § 119 to Korean Patent Application No. 10-2021-0087102, filed on Jul. 2, 2021, in the Korean Intellectual Property Office (KIPO), the contents of which are incorporated by reference herein in their entirety.

BACKGROUND

1. Field

Example embodiments relate to a capacitor and a DRAM (dynamic random access memory) device including the same. More particularly, example embodiments relate to a capacitor having a high capacitance and low leakage currents, and a DRAM device including the same.

2. Description of the Related Art

In a DRAM device, unit memory cell may include one transistor and one capacitor, and the capacitor may be required to have a high capacitance. As the DRAM device is highly integrated, it is difficult for the capacitor included in the DRAM to have a high capacitance and low leakage currents.

SUMMARY

Example embodiments provide a capacitor having a high capacitance and low leakage currents.

Example embodiments provide a DRAM device including a capacitor having a high capacitance and low leakage currents.

According to example embodiments, there is provided a capacitor. The capacitor may include a lower electrode, a dielectric layer structure on the lower electrode, and an upper electrode on the dielectric layer structure. The dielectric layer structure may include a plurality of dielectric layers and at least one insert layer structure between ones of the plurality of dielectric layers. The insert layer structure may include a plurality of zirconium oxide layers and at least one insert layer. The insert layer may be between ones of the plurality of zirconium oxide layers.

According to example embodiments, there is provided a capacitor. The capacitor may include a lower electrode, a dielectric layer structure on the lower electrode, and an upper electrode on the dielectric layer structure. The dielectric layer structure may include a plurality of dielectric layers and at least one insert layer structure between ones of the plurality of dielectric layers. The insert layer structure may include at least a first zirconium oxide layers, an aluminum oxide layer, and a second zirconium oxide stacked sequentially. The dielectric layer structure may include plurality of aluminum oxide layers.

According to example embodiments, there is provided a DRAM device. The DRAM device may include a cell transistor on a substrate, a bit line structure, a capacitor on the bit line structure. The cell transistor may include a gate structure, a first impurity region, and a second impurity region. The bit line structure may be electrically connected to the first impurity region. The capacitor may be electrically connected to the second impurity region. The capacitor may include a lower electrode, a dielectric layer structure on the lower electrode, and an upper electrode on the dielectric layer structure. The dielectric layer structure may include a plurality of dielectric layers and at least one insert layer structure between the plurality of dielectric layers. The dielectric layer structure may have a thickness of 30 Å to 60 Å. The insert layer structure may include a structure in which at least a first zirconium oxide layer, an aluminum oxide layer, and a second zirconium oxide layer stacked sequentially. The dielectric layer structure may include a plurality of aluminum oxide layers.

In example embodiments, the dielectric layer structure may include the insert layer structure. Thus, a crystallinity of the dielectric layers included in the dielectric layer structure may be enhanced and leakage currents of the capacitor may be reduced. Therefore, the capacitor may have a high capacitance and low leakage currents.

BRIEF DESCRIPTION OF THE DRAWINGS

Example embodiments will be more clearly understood from the following detailed description taken in conjunction with the accompanying drawings. FIGS. 1 to 21 represent non-limiting, example embodiments as described herein.

FIG. 1 is a cross-sectional view illustrating a capacitor in accordance with example embodiments;

FIG. 2 is an enlarged cross-sectional view illustrating the capacitor shown in FIG. 1;

FIG. 3 is an enlarged cross-sectional view illustrating a capacitor in accordance with example embodiments;

FIG. 4 is an enlarged cross-sectional view illustrating a capacitor in accordance with example embodiments;

FIG. 5 is an enlarged cross-sectional view illustrating a capacitor in accordance with example embodiments;

FIG. 6 is an enlarged cross-sectional view illustrating a capacitor in accordance with example embodiments;

FIG. 7 is an enlarged cross-sectional view illustrating a capacitor in accordance with example embodiments;

FIG. 8 is an enlarged cross-sectional view illustrating a capacitor in accordance with example embodiments;

FIG. 9 is an enlarged cross-sectional view illustrating a capacitor in accordance with example embodiments;

FIG. 10 is an enlarged cross-sectional view illustrating a capacitor in accordance with example embodiments;

FIGS. 11 to 15 are cross-sectional views illustrating a method of manufacturing a capacitor in accordance with example embodiments;

FIGS. 16 to 17 are cross-sectional views illustrating a method of manufacturing a capacitor in accordance with example embodiments;

FIGS. 18 and 19 are a plan view and a cross-sectional view illustrating a DRAM device including a capacitor in accordance with example embodiments;

FIG. 20 shows the number of defects of leakage currents of thicknesses of each equivalent oxide layer in the first sample of the capacitor and the comparative sample of the capacitor according to the present invention; and FIG. 21 is leakage currents values of thicknesses of each equivalent oxide layer in in a capacitor according to the example embodiments and a capacitor for comparison with the example embodiments.

DESCRIPTION OF EMBODIMENTS

Figure 1:
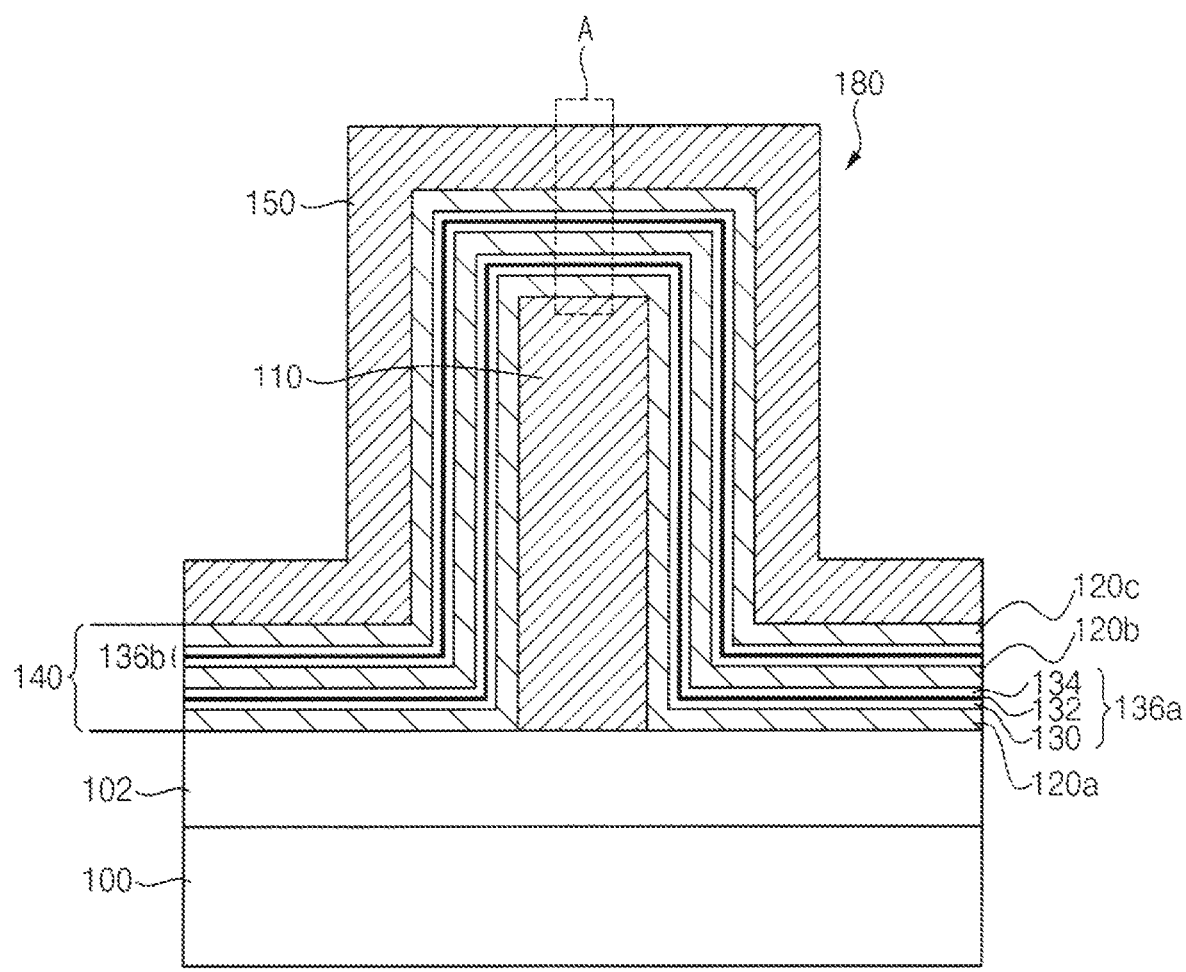
Figure 2:
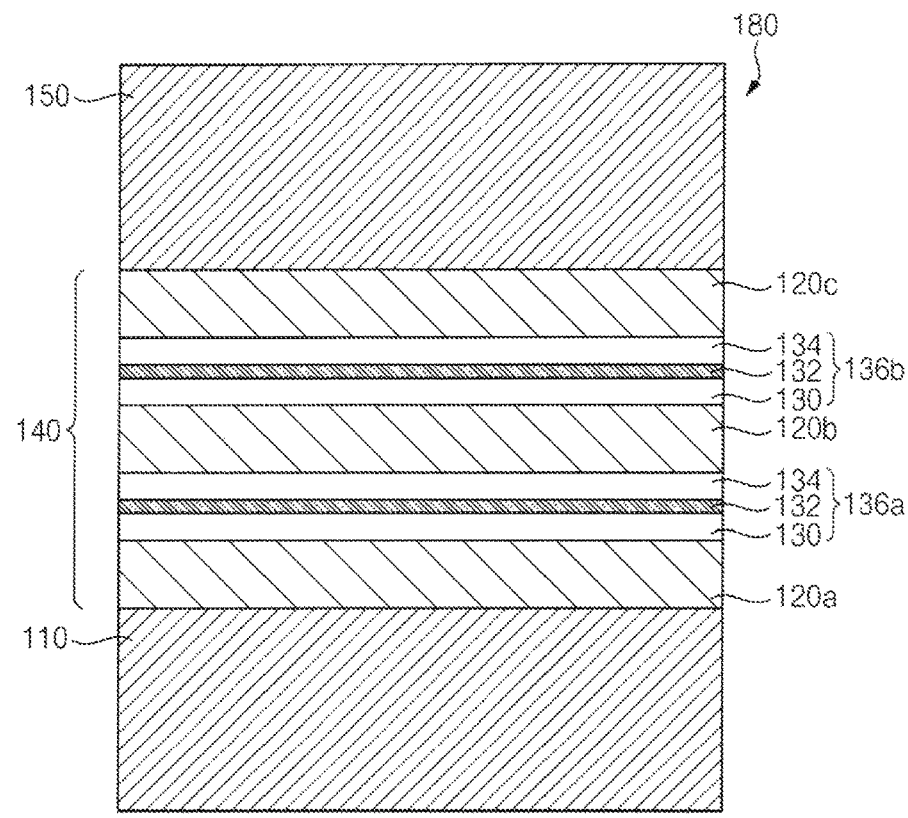
Figure 3:
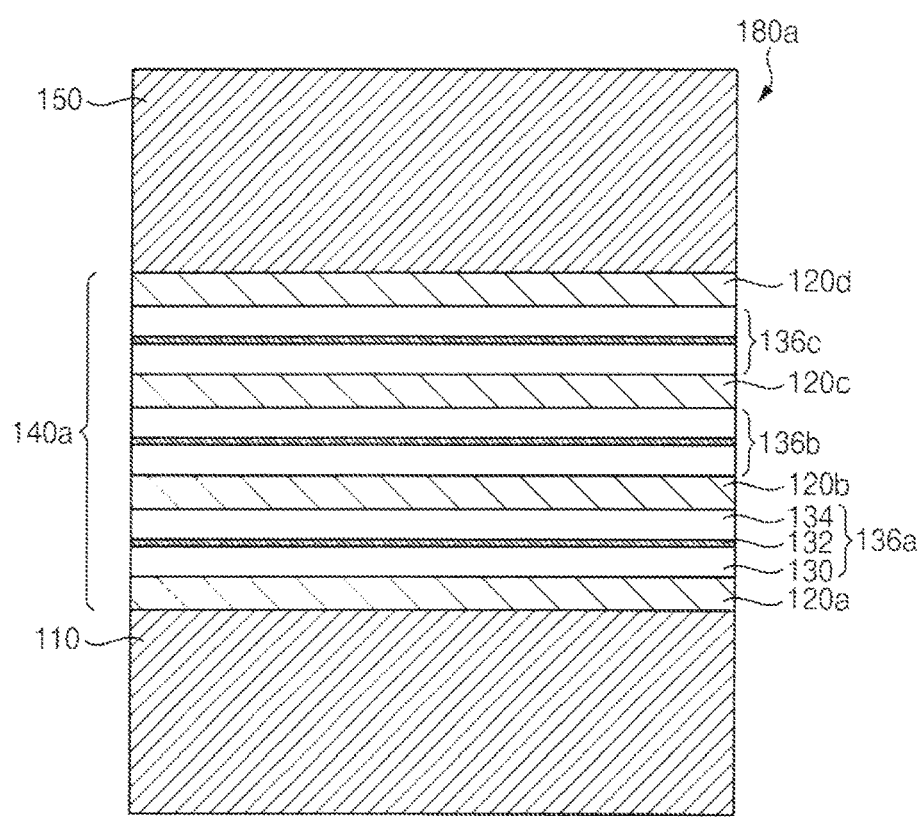

FIG. 1 is a cross-sectional view illustrating a capacitor in accordance with example embodiments. FIG. 2 is an enlarged cross-sectional view illustrating the capacitor shown in FIG. 1. FIG. 3 is an enlarged cross-sectional view illustrating a capacitor in accordance with example embodiments.

FIG. 1 is a vertical cross-sectional view of a capacitor including a lower electrode having pillar shape. FIG. 2 is an enlarged cross-sectional view of a portion A of FIG. 1. The capacitor shown in FIG. 3 is similar to the capacitor of FIGS. 1 and 2, except for the number of insert layer structures included in a dielectric layer structure.

Referring to FIGS. 1 and 2, the capacitor 180 may include a lower electrode 110, a dielectric layer structure 140, and an upper electrode 150.

In example embodiments, the capacitor 180 may be formed on a lower structure 102 on the substrate 100. Although not shown, the lower structure 102 may include a transistor, a contact plug, a conductive line, and an insulating interlayer covering them.

Each of the lower electrode 110 and the upper electrode 150 may include a metal, a metal nitride, or a conductive oxide. For example, each of the lower electrode 110 and the upper electrode 150 may include at least one selected from titanium nitride (TiN), titanium (Ti), tantalum (Ta), tantalum nitride (TaN), ruthenium (Ru), tungsten, tungsten nitride, Nb, NbN, indium tin oxide (ITO), Ta doped $SnO_2$, Nb doped $SnO_2$, Sb doped $SnO_2$, and V-doped $SnO_2$. In example embodiments, a material of the lower electrode 110 may be the same as a material of the upper electrode 150. In some example embodiments, materials of the lower electrode 110 and the upper electrode 150 may be different from each other.

The lower electrode 110 may have various three-dimensional structures.

In example embodiments, the lower electrode 110 may have a three-dimensional structure such as a cylinder shape or pillar shape. FIG. 1, the lower electrode 110 may have the pillar shape. Alternatively, although not shown, the lower electrode may have the cylinder shape.

In some example embodiments, the lower electrode 110 may have a two-dimensional shape such as a flat plate shape. In this case, a cross-sectional view of the capacitor may be similar to the enlarged view shown in FIG. 2. Since a capacitance of the capacitor 180 is determined by a surface area of the lower electrode 110, the lower electrode 110 may have various modified structures for increasing of the capacitance.

The dielectric layer structure 140 may be interposed between the lower electrode 110 and the upper electrode 150. The dielectric layer structure 140 may contact a surface of the lower electrode 110 to cover the surface of the lower electrode 110. The dielectric layer structure 140 may be conformally formed on the surface of the lower electrode 110. For example, when the lower electrode 110 has the two-dimensional shape such as the flat plate shape, the dielectric layer structure 140 having a two-dimensional shape may be formed on the upper surface of the lower electrode 110. Alternatively, when the lower electrode 110 has the pillar shape or the cylinder shape, the dielectric layer structure 140 may be formed along the surface of the lower electrode 110 to have a three-dimensional shape.

For the capacitor 180 having a high capacitance, the dielectric layer structure 140 may be designed to have a high dielectric constant. However, when the dielectric layer structure 140 is formed of a material having a high dielectric constant, leakage currents of the capacitor 180 typically may be increased. That is, the dielectric constant and the leakage currents may have a trade-off relationship. Therefore, it may not be easy for the capacitor 180 to have low leakage currents and a high capacitance.

In example embodiments, for the capacitor 180 having a high capacitance, the dielectric layer structure 140 may be designed to have an equivalent oxide thickness (EOT) of about 5 Å or less, preferably about 3.7 Å or less.

The dielectric layer structure 140 may have a structure in which a plurality of dielectric layers are stacked. In example embodiments, the dielectric layer structure 140 may have a thickness of about 30 Å to about 60 Å. For example, the dielectric layer structure 140 may have a thickness of about 45 Å to about 55 Å.

When the thickness of the dielectric layer structure 140 is less than 30 Å, leakage currents of the capacitor may increase. When the thickness of the dielectric layer structure 140 is greater than 60 Å, it may be difficult for the capacitor to have a target high capacitance, and the capacitor may not be suitable for use in a highly integrated semiconductor device. Hereinafter, a thickness of each layer means a thickness of the layer in a direction perpendicular to the surface of the underlying structure under the layer.

The dielectric layer structure 140 in the capacitor 180 may include dielectric layers 120a, 120b, and 120c and a plurality of insert layer structures 136a and 136b. Each of the dielectric layers 120a, 120b, and 120c may include the same dielectric material, and may serve as a main dielectric material included in the dielectric layer structure 140.

In the dielectric layer structure 140, the insert layer structure 136a and 136b may be between adjacent two dielectric layers in a vertical direction. Thus, the dielectric layers 120a, 120b, and 120c may be separated in the vertical direction by the insert layer structures 136a and 136b.

The dielectric layers 120a, 120b, and 120c may include a metal oxide having a high dielectric constant. For example, the dielectric layers 120a, 120b, and 120c may include at least one selected from $HfO_2$, $ZrO_2$, $TiO_2$, $TaO_2$, and $La_2O_3$. That is, the dielectric layers 120a, 120b, and 120c may include a single metal oxide or have a structure in which a plurality of metal oxides are stacked. For example, the dielectric layers 120a, 120b, and 120c may include hafnium oxide ($HfO_2$).

Each of the insert layer structures 136a and 136b may have a structure in which a first zirconium oxide layer 130, an insert layer 132, and a second zirconium oxide layer 134 are sequentially stacked. The first zirconium oxide layer 130 and the second zirconium oxide layer 134 may directly contact lower and upper surfaces of the insert layer 132, respectively. One insert layer structure 136a and 136b may include one insert layer 132.

Each of the insert layer structures 136a and 136b may be provided to improve crystallinity of layers included in the dielectric layer structure 140 and reduce leakage currents of the capacitor.

That is, in the insert layer structure 136a and 136b, the insert layer 132 may be provided to reduce leakage currents generated in the dielectric layer structure 140. The zirconium oxide layers 130 and 134 may be formed on and under the insert layer 132 to improve crystallinity of layers (e.g., dielectric layers) included in the dielectric layer structure 140. The insert layer 132 may be formed between the first and second zirconium oxide layers 130 and 134, so that the first and second zirconium oxide layers 130 and 134 may be separated in the vertical direction by the insert layer 132. When the first and second zirconium oxide layers 130 and 134 are formed on and under the insert layer 132, the crystallinity of the layers included in the dielectric layer structure 140 may be improved compared to a structure in which only insert layer is interposed between the dielectric layers. Thus, the dielectric layer structure 140 including the insert layer structures 136a and 136b may have a high dielectric constant. In addition, the leakage currents generated in the dielectric layer structure 140 may be decreased by the insert layer 132.

In example embodiments, the insert layer 132 may include a material that selected from aluminum oxide (Al2O3), MgO, BeO, Y2O3, La2O3, CaO, and SiO2. For example, the insert layer 132 may include Al2O3. Hereinafter, it is described that the insert layer is aluminum oxide (Al2O3).

In example embodiments, a thickness of the insert layer 132 may be less than a thickness of each of the first and second zirconium oxide layers 130 and 134

A plurality of the insert layer structures 136a and 136b may be included in the dielectric layer structure 140, and the plurality of insert layer structures 136a and 136b may be spaced apart from each other in the vertical direction.

When the thickness of the insert layers 132 included in the dielectric layer structure 140 is increased, a total dielectric constant of the dielectric layer structure 140 may decrease. Further, when the thickness of insert layer increases, the dielectric layers completely separated in the vertical direction by the insert layer. Thus, the crystallinity of the dielectric layer may be reduced, so that the dielectric constant of the dielectric layer structure may be further decreased.

Therefore, preferably, the insert layer 132 may be formed to have a minimum thickness capable of reducing the leakage currents. In example embodiments, the sum of the thicknesses of the respective insert layers 132 included in the dielectric layer structure 140 may be about 1 Å to about 3 Å. If the sum of the thicknesses of the respective insert layers 132 included in the dielectric layer structure 140 is less than 1 Å, it is difficult to suppress the leakage currents generated in the dielectric layer structure 140. If the sum of the thicknesses of the respective inset layers included in the dielectric layer structure 140 is greater than 3 Å, a total dielectric constant of the dielectric layer structure 140 may be decreased. For example, the sum of the thicknesses of the respective insert layers 132 may be about 1 Å to about 2 Å.

Meanwhile, the sum of the thicknesses of the respective insert layers 132 included in the dielectric layer structure 140 is fixed within the range. Thus, when the number of the insert layer structures 136a and 136b included in the dielectric layer structure 140 is increased, the thickness of the insert layer 132 included in each of the insert layer structures 136a and 136b may be decreased.

When a plurality of the insert layer structures 136a and 136b are included in the dielectric layer structure 140, a plurality of the insert layers 132 may be formed in the dielectric layer structure 140. In this case, the thickness of each of the insert layers 132 in the insert layer structures 136a and 136b may be decreased, but the sum of the thicknesses of the insert layers 132 may maintain in the range. Thus, the leakage currents in the dielectric layer structure 140 may be decreased by the insert layer structures 136a, 136b. In addition, since the thickness of each of the insert layers 132 included in the insert layer structures 136a and 136b is decreased, the crystallinity of the dielectric layers and the zirconium oxide layers included in the dielectric layer structure 140 may be increased. Therefore, the dielectric constant of the dielectric layer structure 140 may be high.

Hereinafter, the dielectric layers in the dielectric layer structure 140 are referred to as first to n-th dielectric layers in the order from an upper surface of the lower electrode, and the insert layer structures are referred to as first to n-th insert layer structures in the order from the upper surface of the lower electrode.

In the capacitor 180 shown in FIG. 2, two insert layer structures 136a and 136b may be included in the dielectric layer structure 140. The dielectric layer structure 140 may include insert layers 132 having the number equal to the number of the insert layer structures 136a and 136b. Thus, the capacitor shown in FIG. 2, the dielectric layer structure 140 may include two insert layers 132.

As shown in FIG. 2, the dielectric layer structure 140 may have a first dielectric layer 120a, a first insert layer structure 136a, a second dielectric layer 120b, a second insert layer structure 136b and a third dielectric layer 120c sequentially stacked on the upper surface of the lower electrode 110.

Since the sum of the thicknesses of the respective insert layers 132 included in the first and second insert layer structures 136a and 136b is about 1 Å to about 3 Å, the insert layer 132 included in one insert layer structure 136a and 136b may be, for example, in the range of about 0.5 Å to about 1.5 Å.

In the capacitor 180a illustrated in FIG. 3, three insert layer structures 136a, 136b and 136c may be included in the dielectric layer structure 140a. Thus, in the capacitor 180a illustrated in FIG. 3, the dielectric layer structure 140a may include three insert layers 132.

As shown in FIG. 3, the dielectric layer structure 140a may have a first dielectric layer 120a, a first insert layer structure 136a, a second dielectric layer 120b, a second insert layer structure 136b, a third dielectric layer 120c, a third insert layer structure 136c, and a fourth dielectric layer 120d sequentially stacked on the upper surface of the lower electrode 110.

Since the sum of the thicknesses of the respective insert layers 132 included in the first to third insert layer structures 136a, 136b, and 136c is about 1 Å to about 3 Å, the insert layer 132 included in one insert layer structure 136a and 136b may be, for example, in the range of about 0.3 Å to about 1 Å.

Each of the first and second zirconium oxide layers 130 and 134 included in the insert layer structures 136a and 136b may have a thickness of about 3 Å to about 20 Å. When the thickness of each of the first and second zirconium oxide layers 130 and 134 is less than 3 Å, it may be difficult to increase the crystallinity of the layers included in the dielectric layer structure 140a. When the thickness of at least one of the first and second zirconium oxide layers 130 and 134 is greater than 20 Å, a total thickness of the dielectric layer structure 140a may be increased, so that it may be difficult for the capacitor to have a target high capacitance.

FIGS. 2 and 3 illustrate that two and three insert layer structures are included in the dielectric layer structure, respectively, but the number of insert layer structures included in the dielectric layer structure is not limited thereto, and may be four or more. However, even if the number of insert layer structures in the dielectric layer structure increases, the total thickness of the dielectric layer structure may have the thickness of about 30 Å to about 60 Å.

As the plurality of insert layer structures are included in the dielectric layer structure of the capacitor, the crystallinity of the layers included in the dielectric layer structure may be improved, and thus the capacitor may have a high capacitance. Further, the leakage currents of the capacitor may be decreased.

Figure 4:
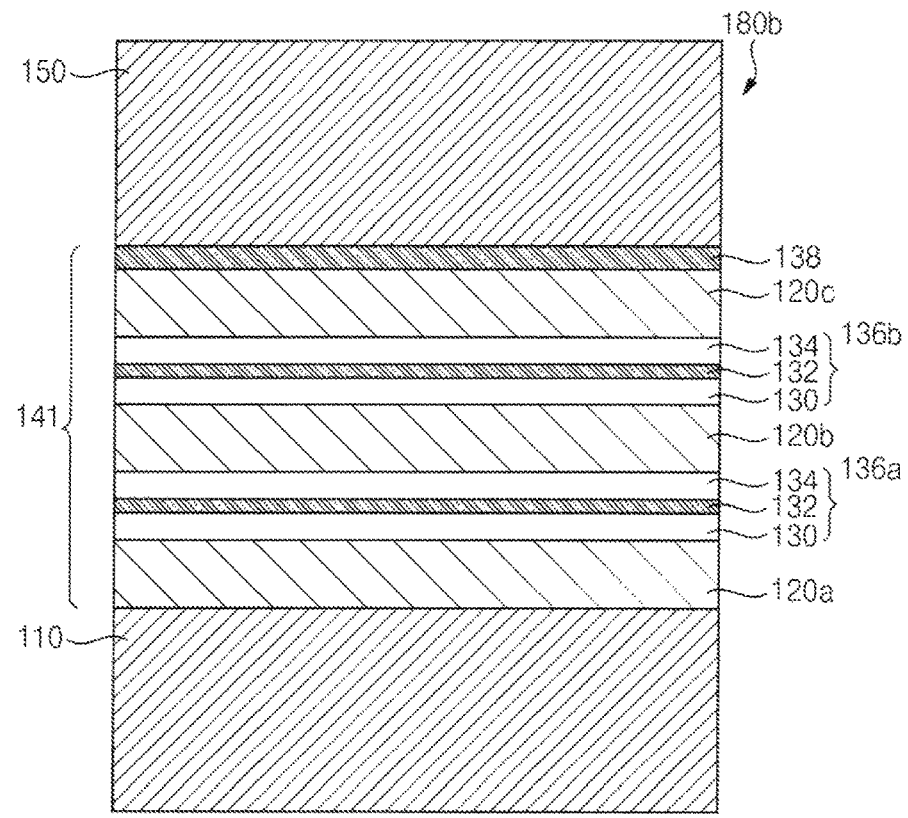
Figure 5:
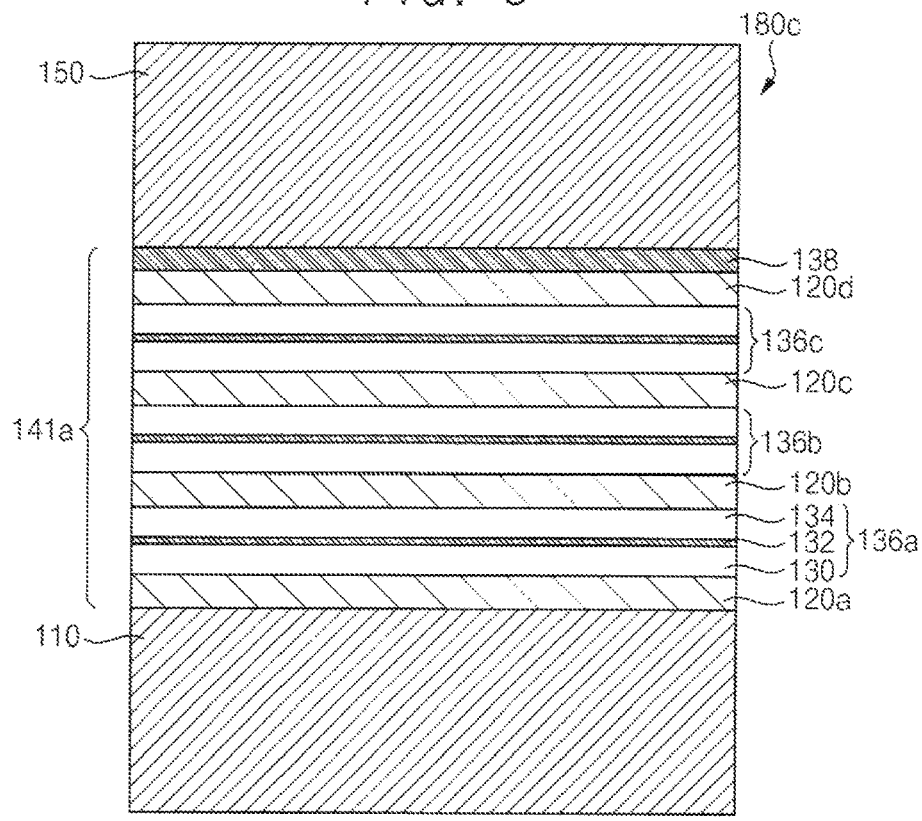

FIG. 4 is an enlarged cross-sectional view illustrating a capacitor in accordance with example embodiments. FIG. 5 is an enlarged cross-sectional view illustrating a capacitor in accordance with example embodiments.

The capacitor shown in FIG. 4 is the same as or similar to the capacitor shown in FIGS. 1 and 2, except for an upper interface layer. The capacitor shown in FIG. 5 is the same as or similar to the capacitor shown in FIG. 3, except for an upper interface layer.

Referring to FIG. 4, the capacitor 180b may have a stacked structure including the lower electrode 110/a dielectric layer structure 141/the upper electrode 150. The dielectric layer structure 141 may include dielectric layers 120a, 120b, and 120c, two insert layer structures 136a and 136b, and an upper interface layer 138 on an uppermost dielectric layer 120c. In example embodiments, a thickness of the upper interface layer 138 may be greater than a thickness of each of the insert layers 132.

The dielectric layer structure 141 may include the first dielectric layer 120a, the first insert layer structure 136a, the second dielectric layer 120b, the second insert layer structure 136b, the third dielectric layer 120c and the upper interface layer 138 sequentially stacked on an surface of the lower electrode 110. Each of the first and second insert layer structure 136a and 136b may include the first zirconium oxide layer 130, the insert layer 132, and the second zirconium oxide layer 134 sequentially stacked. The upper interface layer 138 may be between the third dielectric layer 120c and the upper electrode 150.

In example embodiments, the upper interface layer 138 may include a material selected from Al2O3, MgO, BeO, Y2O3, La2O3, CaO, and SiO2. For example, the upper interface layer 138 and the insert layer 132 may include the same material. For example, the upper interface layer 138 may include aluminum oxide (Al2O3). As the upper interface layer 138 is further formed, the leakage currents of the capacitor 180b may be decreased.

Referring to FIG. 5, the capacitor 180c may have a stacked structure including the lower electrode 110/a dielectric layer structure 141a/the upper electrode 150. The dielectric layer structure 141a may include dielectric layers 120a, 120b, 120c, and 120d and three insert layer structures 136a, 136b, and 136c, and an upper interface layer 138 on an uppermost dielectric layer 120d.

The dielectric layer structure 141a may include the first dielectric layer 120a, the first insert layer structure 136a, the second dielectric layer 120b, the second insert layer structure 136b, the third dielectric layer 120c, the third insert layer structure 136c, the fourth dielectric layer 120d, and the upper interface layer 138 sequentially stacked on an upper surface of the lower electrode 110. The upper interface layer 138 may be between the fourth dielectric layer 120d and the upper electrode 150.

Figure 6:
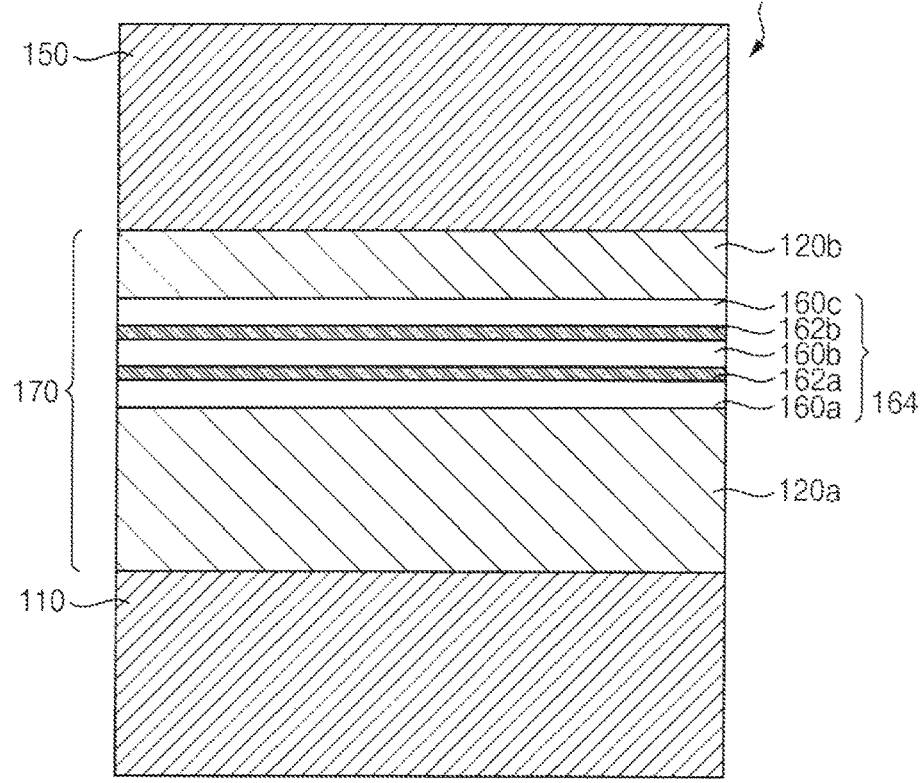
Figure 7:
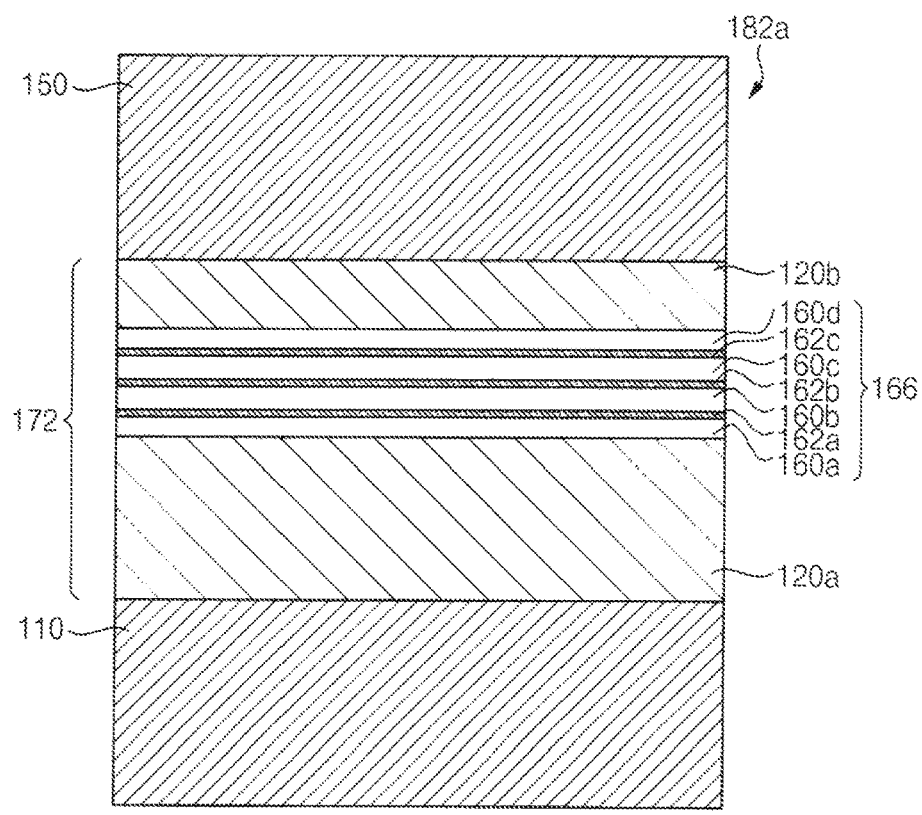

FIG. 6 is an enlarged cross-sectional view illustrating a capacitor in accordance with example embodiments. FIG. 7 is an enlarged cross-sectional view illustrating a capacitor in accordance with example embodiments.

The capacitor shown in FIG. 7 is similar to the capacitor of FIG. 6, except for the number of insert layers included in the insert layer structure.

Referring to FIG. 6, the capacitor 182 may include the lower electrode 110, a dielectric layer structure 170, and the upper electrode 150.

In example embodiments, a thickness of the dielectric layer structure 170 may be about 30 Å to about 60 Å. For example, the thickness of the dielectric layer structure 170 may be about 45 Å to about 55 Å.

The dielectric layer structure 170 of the capacitor 182 may include dielectric layers 120a and 120b and an insert layer structure 164. The insert layer structure 164 may be between the dielectric layers 120a and 120b, so that the dielectric layers 120a and 120b may be separated in the vertical direction by the insert layer structure 164.

The dielectric layers 120a and 120b may include a metal oxide having a high dielectric constant. For example, the dielectric layers 120a and 120b may include at least one selected from HfO2, ZrO2, TiO2, TaO2, and La2O3. That is, the dielectric layers 120a and 120b may include a single metal oxide or have a structure in which a plurality of metal oxides are stacked. For example, the dielectric layers 120a and 120b may include hafnium oxide (HfO2).

In example embodiments, the dielectric layer structure 170 may include a single insert layer structure 164. The insert layer structure 164 may include at least two insert layers 162a and 162b between the zirconium oxide layers 160a, 160b, and 160c. Therefore, even if one insert layer structure 164 is included in the dielectric layer structure 140, two or more insert layers 162a and 162b may be included in the dielectric layer structure 140.

Each of the insert layers 162a and 162b may be positioned to vertically separate the zirconium oxide layers 160a, 160b, and 160c. The insert layers 162a and 162b may be spaced apart from each other in the zirconium oxide layers 160a, 160b, and 160c. Each of the insert layers 162a and 162b may be between the zirconium oxide layers 160a, 160b, and 160c.

In example embodiments, the insert layers 162a and 162b may include a material selected from aluminum oxide (Al2O3), MgO, BeO, Y2O3, La2O3, CaO, and SiO2. For example, the insert layers 162a and 162b may include Al2O3. Hereinafter, it is described that the insert layers 162a and 162b is aluminum oxide (Al2O3).

In example embodiments, a thickness of each of the insert layers 162a and 162b may be less than a thickness of each of the zirconium oxide layers 160a, 160b, and 160c. In example embodiments, each of the zirconium oxide layers 160a, 160b, and 160c included in the insert layer structure 164 may have a thickness of about 3 Å to about 20 Å.

In example embodiments, a sum of the thicknesses of the insert layers 162a and 162b included in the dielectric layer structure 170 may be about 1 Å to about 3 Å. For example, the sum of the thicknesses of the insert layers 162a and 162b included in the dielectric layer structure 170 may be about 1 Å to about 2 Å.

When a single insert layer structure 164 is included in the dielectric layer structure 170, and the insert layer structure 164 may be positioned higher than a central portion in the vertical direction of the dielectric layer structure 170, the crystallinity of the layers included in the insert layer structure 164 may be enhanced. Thus, when a single insert layer structure 164 is included in the dielectric layer structure 170, preferably, the insert layer structure 164 may be positioned higher than the central portion in the vertical direction of the dielectric layer structure 170.

In the capacitor 182 shown in FIG. 6, one insert layer structure 164 may be included in the dielectric layer structure 170, and the insert layer structure 164 may include two insert layers 162a and 162b in zirconium oxide layers. Thus, in the capacitor 182 shown in FIG. 6, two insert layers 162a and 162b may be included in the dielectric layer structure 170.

As shown in FIG. 6, the insert layer structure 164 may include the first zirconium oxide layer 160a, the first insert layer 162a, the second zirconium oxide layer 160b, the second insert layer 162b, and the third zirconium oxide layer 160c stacked. In this case, since the sum of the thicknesses of the respective insert layers included in the insert layer structure 164 is about 1 Å to about 3 Å, the thickness of each of insert layers may be, for example, 0.5 Å to 1.5 Å.

In the capacitor 182a shown in FIG. 7, one insert layer structure 166 may included in the dielectric layer structure 172, and the insert layer structure 166 includes three insert layers 162a, 162b, and 162c in zirconium oxide layers. Thus, in the capacitor 182a shown in FIG. 7, three insert layers 162a, 162b, and 162c may be included in the dielectric layer structure 172.

In the capacitor 182 shown in FIG. 7, the insert layer structure 166 may include the first zirconium oxide layer 160a, the first insert layer 162a, the second zirconium oxide layer 160b, the second insert layer 162b, and the third zirconium oxide layer 160c, the third insert layer 162c, and the fourth zirconium oxide layer 160d stacked. In this case, since a sum of thicknesses of the insert layers 162a, 162b, and 162c included in the insert layer structure 166 is about 1 Å to about 3 Å, a thickness of one insert layer 162a, 162b, 162c may be about 0.3 Å to about 1 Å.

FIGS. 6 and 7 illustrate that two and three insert layers are included in the insert layer structures, respectively, but the number of insert layers included in the insert layer structure is not limited thereto, and may be four or more.

Figure 8:
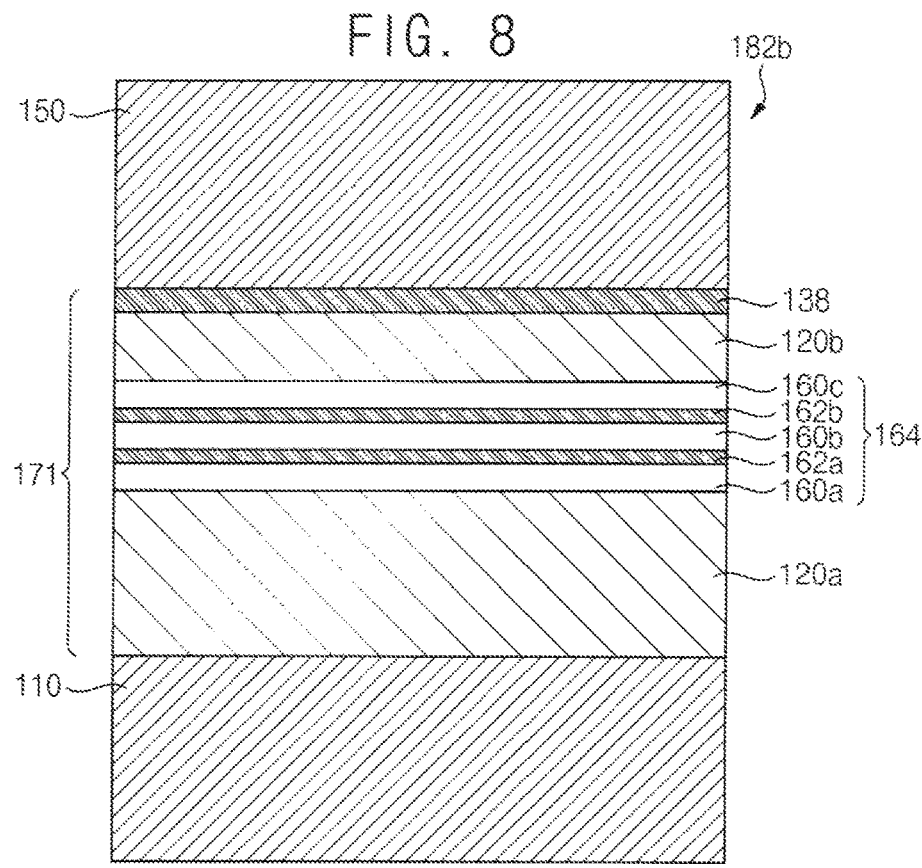

FIG. 8 is an enlarged cross-sectional view illustrating a capacitor in accordance with example embodiments.

The capacitor shown in FIG. 8 is the same as or similar to the capacitor shown in FIG. 6, except for an upper interface layer.

Referring to FIG. 8, the capacitor 182b may have a stacked structure including the lower electrode 110/a dielectric layer structure 171/the upper electrode 150.

The dielectric layer structure 171 may include the first dielectric layer 120a, the insert layer structure 164, the second dielectric layer 120b and the upper interface layer 138 sequentially stacked on the upper surface of the lower electrode 110. The insert layer structure 164 may include the first zirconium oxide layer 160a, the first insert layer 162a, the second zirconium oxide layer 160b, the second insert layer 162b, and the third zirconium oxide layer 160c stacked. The upper interface layer 138 may be between the second dielectric layer 120b and the upper electrode 150.

In example embodiments, although not shown, the capacitor may further include the upper interface layer between the second dielectric layer 120b and the upper electrode 150 in the capacitor shown in FIG. 7.

Figure 9:
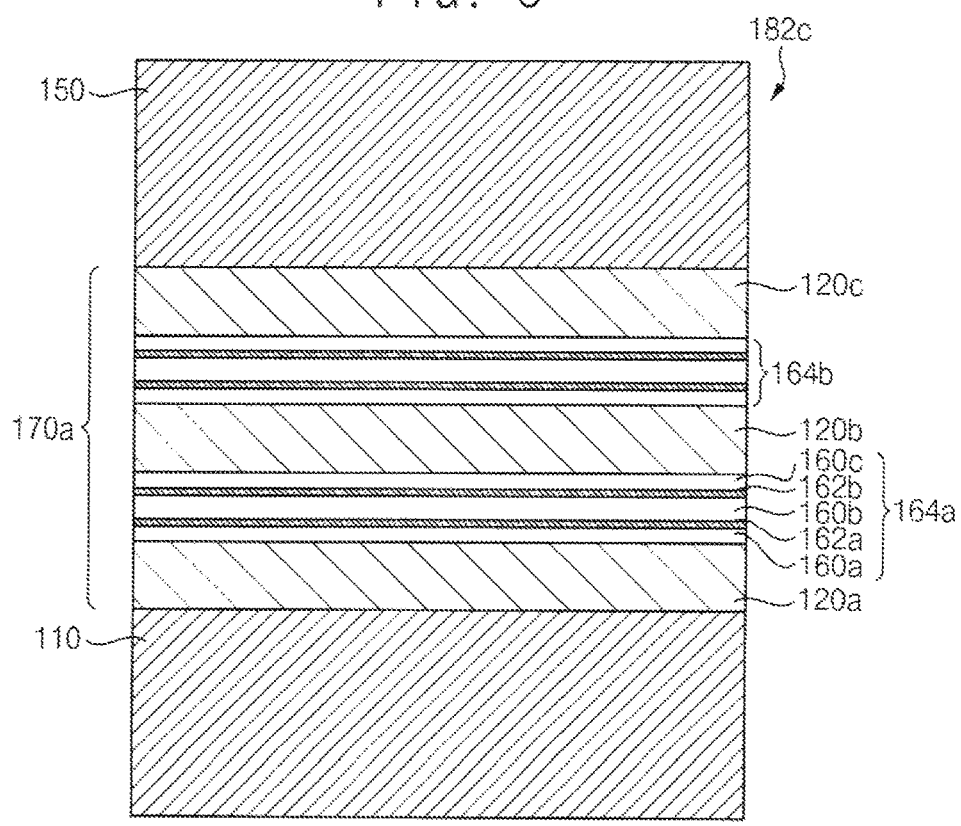

FIG. 9 is an enlarged cross-sectional view illustrating a capacitor in accordance with example embodiments.

The capacitor shown in FIG. 9 is similar to the capacitor of FIG. 6, except for the number of insert layer structures included in the dielectric layer structure.

Referring to FIG. 9, a dielectric layer structure 170a in the capacitor 182c may include a plurality of insert layer structures 164a and 164b.

Two insert layer structures 164a and 164b may be included in the dielectric layer structure 170a. The dielectric layer structure 170a may have the first dielectric layer 120a, the first insert layer structure 164a, the second dielectric layer 120b, the second insert layer structure 164b, and the third dielectric layer 120c sequentially stacked on an upper surface of the lower electrode 110. Each of the first and second insert layer structures 164a and 164b may include the first zirconium oxide layer 160a, the first insert layer 162a, the second zirconium oxide layer 160b, the second insert layer 162b, and the third zirconium oxide layer 160c stacked. Since two insert layers are included in each of the first and second insert layer structures 164a and 164b, four insert layers may be included in the dielectric layer structure 170a.

Since a sum of thicknesses of the respective insert layers 162a and 162b included in the first and second insert layer structures 164a and 164b may be about 1 Å to about 3 Å, a thickness of one insert layer 132 may be about 0.25 Å to about 0.75 Å.

Figure 10:
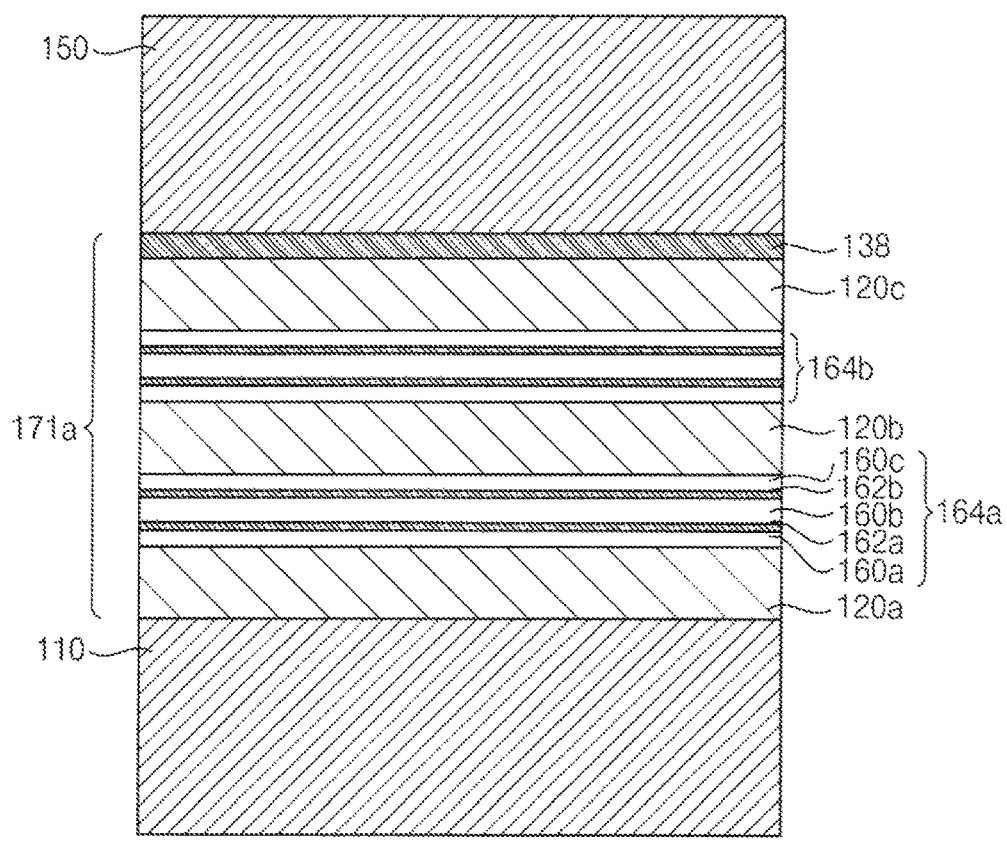

FIG. 10 is an enlarged cross-sectional view illustrating a capacitor in accordance with example embodiments.

The capacitor shown in FIG. 10 is similar to or the same as the capacitor shown in FIG. 9, except for an upper interface layer.

Referring to FIG. 10, the capacitor may further include an upper interface layer 138 between the third dielectric layer 120c and the upper electrode 150 in the capacitor shown in FIG. 9.

Hereinafter, an example of a method of manufacturing a capacitor including the lower electrode having the pillar shape may be described.

FIGS. 11 to 15 are cross-sectional views illustrating a method of manufacturing a capacitor in accordance with example embodiments.

Figure 11:
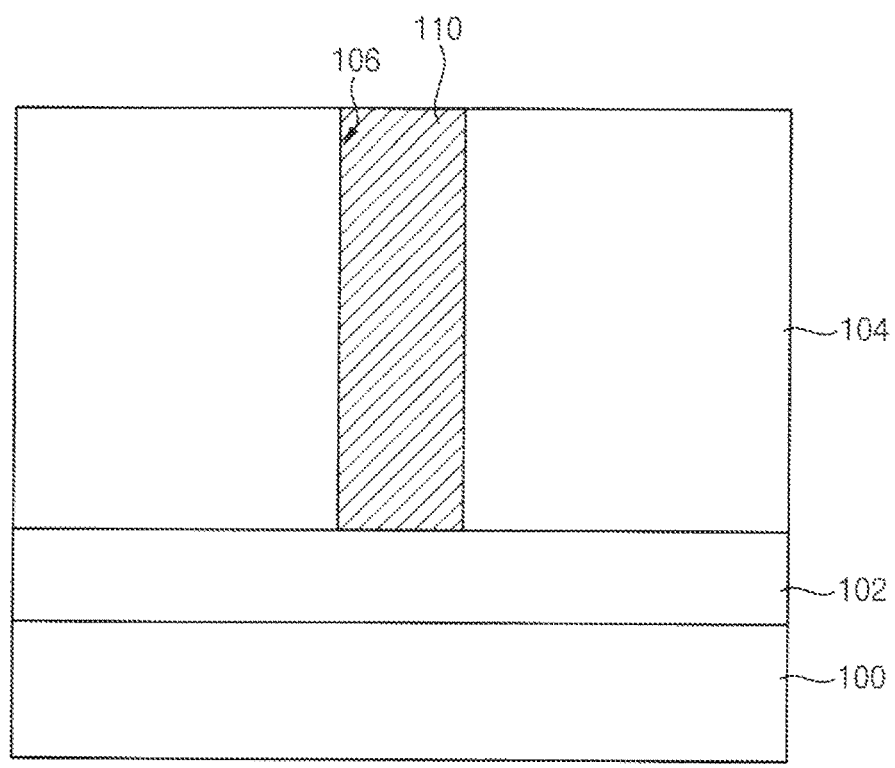

Referring to FIG. 11, a mold layer 104 including a hole 106 may be formed on a substrate 100. The hole 106 may be positioned at a portion for forming a lower electrode.

Before forming the mold layer 104, a lower structure 102 including lower circuits including a transistor, a contact plug, and a conductive line and an insulating interlayer covering the lower circuits may be further formed on the substrate 100.

A lower electrode layer may be formed on the mold layer 104 to fill the hole 106. The lower electrode layer may be polished until an upper surface of the mold layer 104 may be exposed to form a lower electrode 110 in the hole 106.

In example embodiments, the lower electrode layer may be deposited by a deposition process such as physical vapor deposition (PVD) process, chemical vapor deposition (CVD) process, and atomic layer deposition (ALD) process. The polishing process may include a chemical mechanical polishing process and/or an etch-back process.

In some example embodiments, the lower electrode 110 may be formed by forming a lower electrode layer on the lower structure 102 and patterning the lower electrode layer by a photolithography process. In this case, the mold layer may not be formed.

Figure 12:
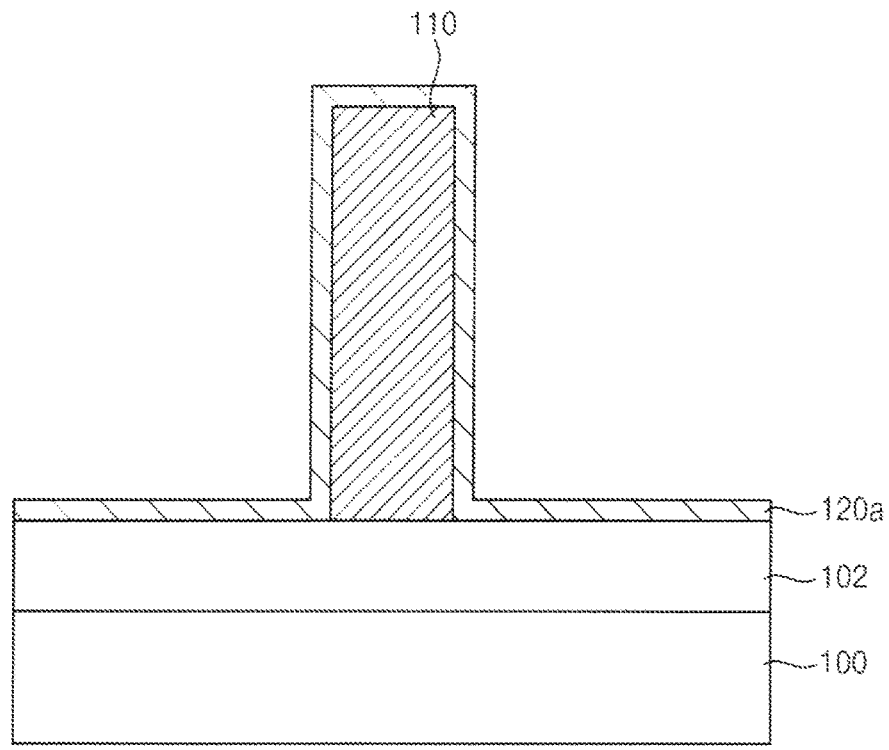

Referring to FIG. 12, the mold layer 104 may be removed. Thus, a sidewall and an upper surface of the lower electrode 110 having the pillar shape may be exposed.

A first dielectric layer 120a may be formed to have a uniform thickness on the sidewall and the upper surface of the lower electrode 110 and the lower structure 102. The first dielectric layer 120a may include a metal oxide having a high dielectric constant. The first dielectric layer 120a may include, for example, at least one selected from $HfO_2$, $ZrO_2$, $TiO_2$, $TaO_2$, and $La_2O_3$.

In example embodiments, the first dielectric layer 120a may be formed by an atomic layer deposition process.

Figure 13:
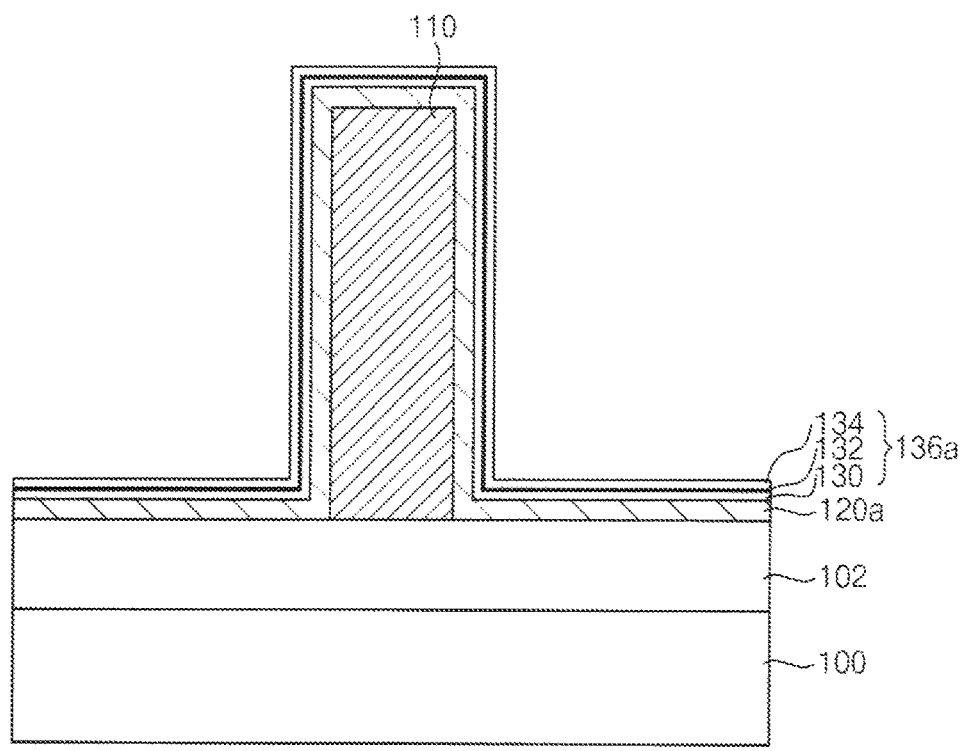

Referring to FIG. 13, a first insert layer structure 136a may be formed on the first dielectric layer 120a. The first insert layer structure 136a may have a structure including a first zirconium oxide layer 130, an insert layer 132, and a second zirconium oxide layer 134 sequentially stacked. The insert layer 132 may include, e.g., $Al_2O_3$.

Particularly, the first zirconium oxide layer 130 may be formed on the first dielectric layer 120a. In example embodiments, the first zirconium oxide layer 130 may be formed by an atomic layer deposition process. For example, the first zirconium oxide layer 130 may be formed by performing one cycle consisting of inflowing zirconium precursor, purging, inflowing oxidizing agent, and purging, once or plural times. The oxidizing agent may include O3, H2O or O2.

An aluminum oxide layer serving as an insert layer 132 may be formed on the first zirconium oxide layer 130. In example embodiments, the aluminum oxide layer may be formed by an atomic layer deposition process.

For example, the aluminum oxide layer may be formed by performing one cycle consisting of inflowing aluminum precursor, purging, inflowing oxidizing agent, and purging, once or plural times. The oxidizing agent may include O3, H2O or O2. By the above process, an aluminum oxide layer having a thin thickness of, e.g., 1 Å or less may be formed.

For another example, the aluminum oxide layer may be formed by performing one cycle of inflowing zirconium precursor, inflowing aluminum precursor, purging, inflowing oxidizing agent and purging, once or plural times. As such, when the zirconium precursor is introduced before inflowing the aluminum precursor, an amount of adsorbing of the aluminum precursor may be reduced. Therefore, compared to the case where the zirconium precursor is not introduced before inflowing the aluminum precursor, a thickness of the aluminum oxide layer formed by the one cycle may be decreased. When the zirconium precursor is introduced before inflowing the aluminum precursor, an aluminum oxide layer having a thin thickness may be formed. For example, an aluminum oxide layer having a thickness of 0.8 Å or less may be formed.

The second zirconium oxide layer 134 may be formed on the aluminum oxide layer. In example embodiments, the second zirconium oxide layer 134 may be formed by an atomic layer deposition process. For example, the second zirconium oxide layer 134 may be formed by performing one cycle consisting of inflowing zirconium precursor, purging, inflowing oxidizing agent, and purging, once or plural times.

Each of the first zirconium oxide layer 130, the aluminum oxide layer and the second zirconium oxide layer 134 may be deposited at a temperature of about 200° C. to about 500° C. If the deposition process of the first zirconium oxide layer 130, the aluminum oxide layer and the second zirconium oxide layer 134 is performed at 500° C. or higher, it may be difficult for layer to stably grow. If the deposition process of the first zirconium oxide layer 130, the aluminum oxide layer and the second zirconium oxide layer 134 is performed at 200° C. or less, the respective precursors are not thermally decomposed, the deposition of the layer may be difficult. Preferably, the deposition process of the first zirconium oxide layer 130, the aluminum oxide layer and the second zirconium oxide layer 134 may be performed at a temperature of 200° C. to 400° C.

By the above process, the first insert layer structure 136a may be formed.

Figure 14:
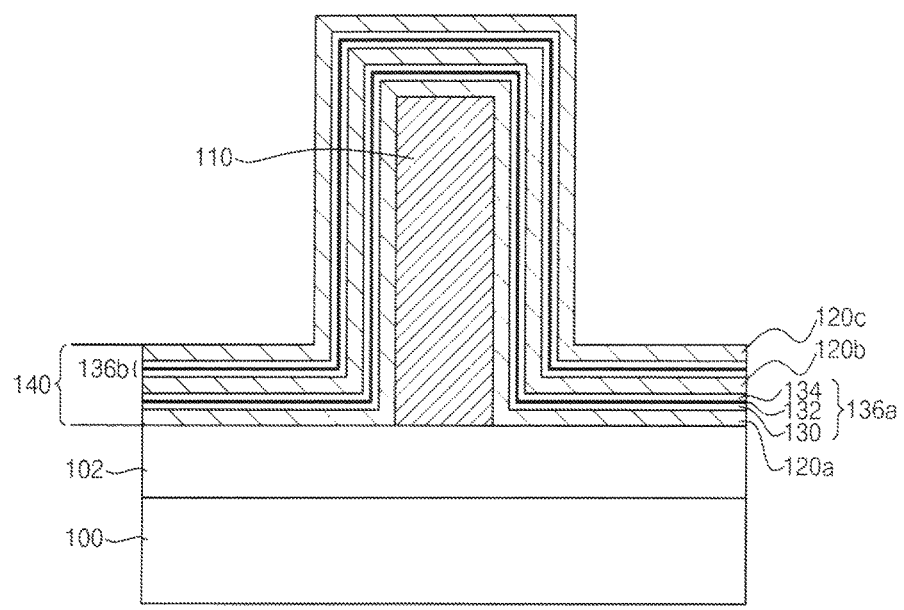

Referring to FIG. 14, a second dielectric layer 120b, a second insert layer structure 136b, and a third dielectric layer 120c may be sequentially formed on the first insert layer structure 136a.

The second dielectric layer 120b and the third dielectric layer 120c may be formed by substantially the same process for forming the first dielectric layer 120a. The second insert layer 136b may be formed by substantially the same process for forming the first insert layer structure 136a. Thus, a dielectric layer structure 140 as shown in FIGS. 1 and 2 may be formed.

In some example embodiments, an upper interface layer may be further formed on the third dielectric layer 120c. The upper interface layer may be formed by an atomic layer deposition process. Thus, a dielectric layer structure as shown in FIG. 4 may be formed, and a capacitor as shown in FIG. 4 may be formed by subsequent processes.

In some example embodiments, a third insert layer structure and a fourth dielectric layer may be further formed on the third dielectric layer 120c. The third dielectric layer and the fourth dielectric layer may be formed by substantially the same process for forming the first dielectric layer 120a. The third insert layer structure may be formed by substantially the same process for forming the first insert layer structure. By the above process, a dielectric layer structure as shown in FIG. 3 may be formed, and a capacitor as shown in FIG. 3 may be formed by subsequent processes.

In some example embodiments, an upper interface layer may be further formed on the fourth dielectric layer. Thus, a dielectric layer structure as shown in FIG. 5 may be formed, and a capacitor as shown in FIG. 5 may be formed by subsequent processes.

Figure 15:
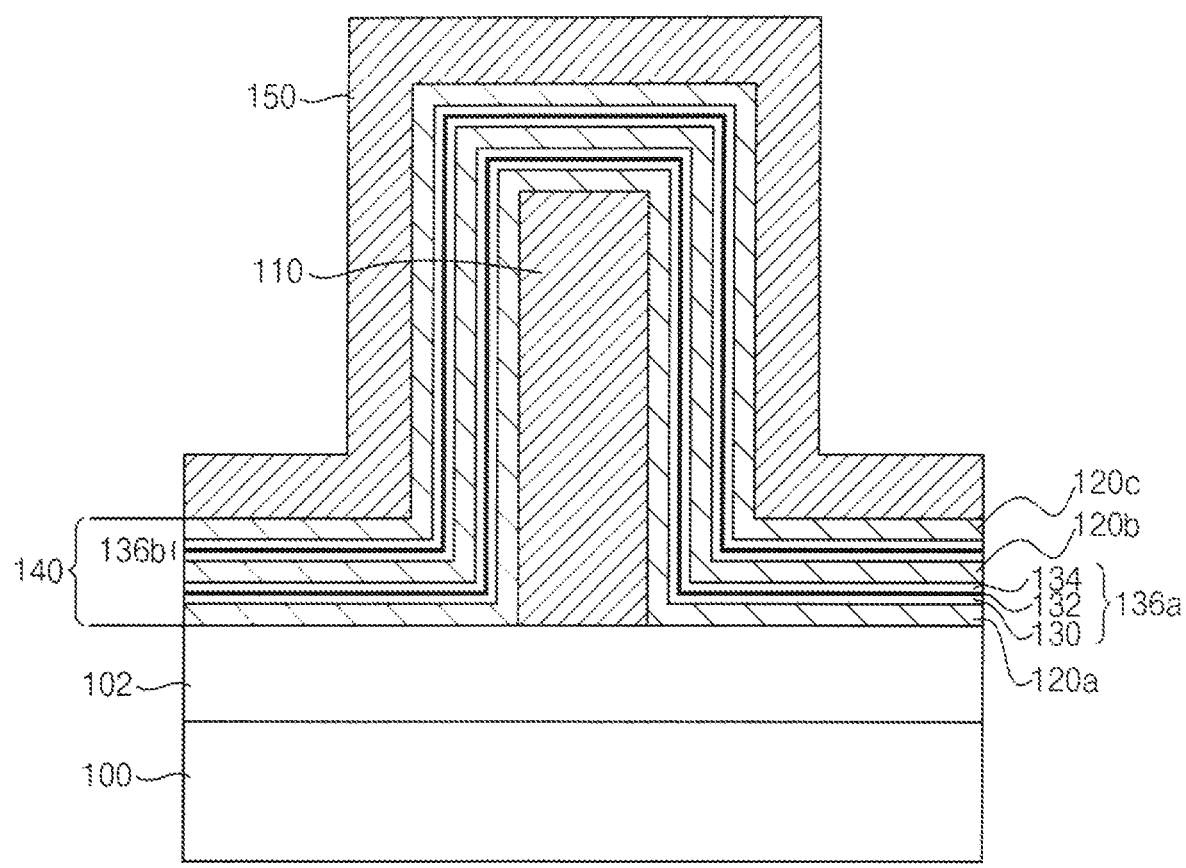

Referring to FIG. 15, an upper electrode 150 may be formed on the dielectric layer structure 140.

In example embodiments, the upper electrode 150 may be formed of the same material as the lower electrode 110. Alternatively, the upper electrode 150 may be formed of a material different from that of the lower electrode 110.

In example embodiments, the upper electrode 150 may be formed by a deposition process such as a physical vapor deposition (PVD) process, a chemical vapor deposition (CVD) process, and an atomic layer deposition (ALD) process.

In example embodiments, after forming the upper electrode 150, a heat treatment process may be further performed. The layers included in the dielectric layer structure 140 may be additionally crystallized by the heat treatment process.

Figure 16:
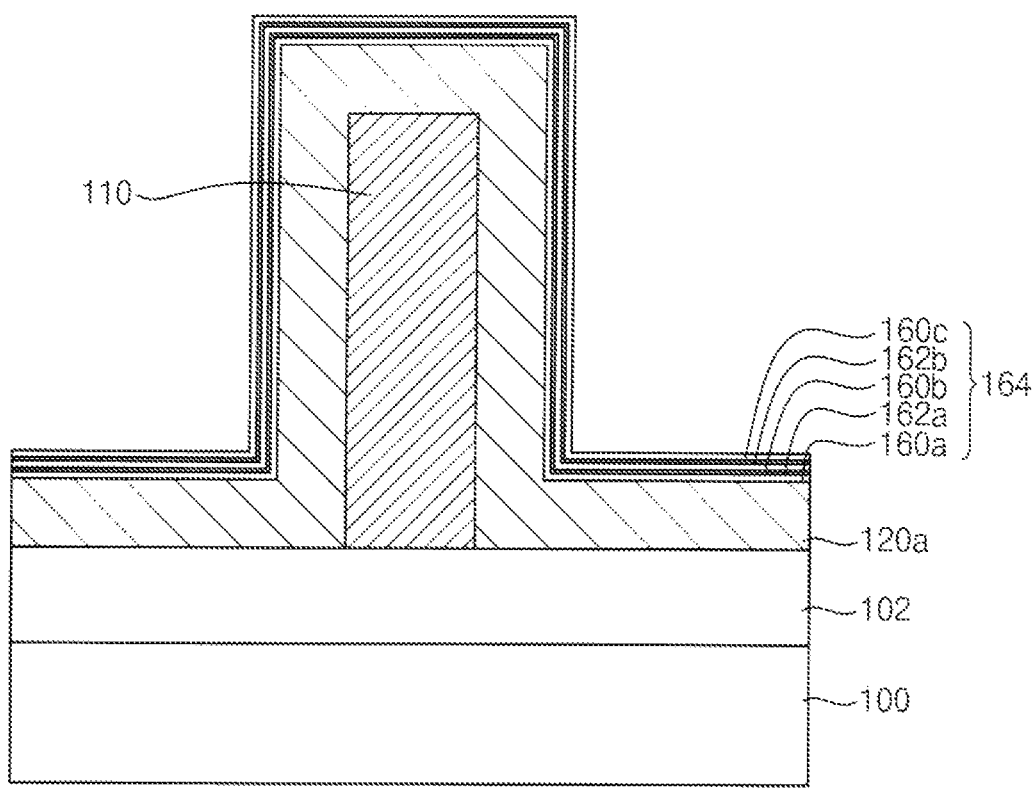
Figure 17:
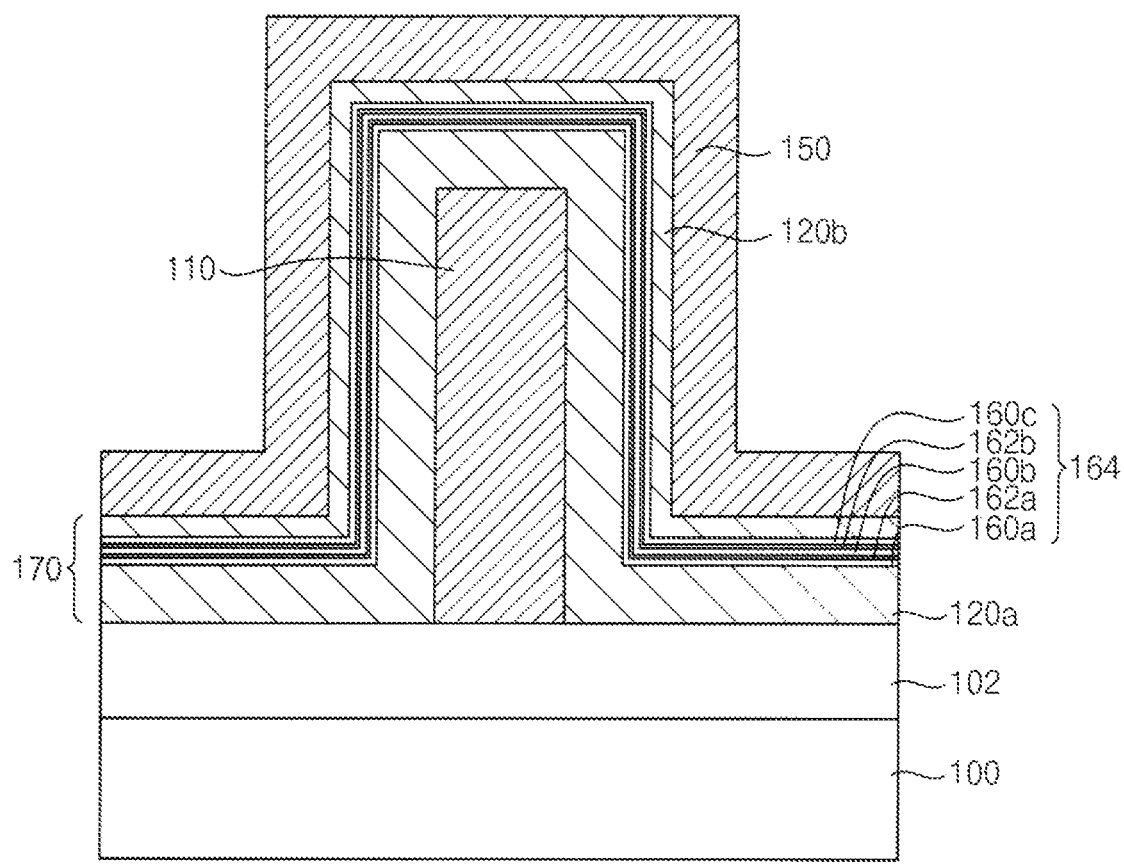

FIGS. 16 to 17 are cross-sectional views illustrating a method of manufacturing a capacitor in accordance with example embodiments.

First, the process described with reference to FIG. 11 may be performed, and then the mold layer is removed.

Referring to FIG. 16, a first dielectric layer 120a may be formed on a surface of the lower electrode 110 having the pillar shape. A first insert layer structure 164 may be formed on the first dielectric layer 120a. The first insert layer structure 164 may include at least two insert layers in the zirconium oxide layers.

In example embodiments, the first insert layer structure 164 may include a first zirconium oxide layer 160a, a first insert layer 162a, a second zirconium oxide layer 160b, a second insert layer 162b, and a third zirconium oxide layers 160c sequentially stacked.

In example embodiments, each of the first to third zirconium oxide layers 160a, 160b, and 160c may be formed by an atomic layer deposition process. For example, each of the first to third zirconium oxide layers 160a, 160b, and 160c may be formed by performing one cycle consisting of inflowing zirconium precursor, purging, inflowing oxidizing agent and purging, once or plural times. The oxidizing agent may include O3, H2O or O2.

Each of the first and second insert layers 162a and 162b may be formed of an aluminum oxide layer. In example embodiments, the aluminum oxide layer may be formed by an atomic layer deposition process.

For example, the aluminum oxide layer may be formed by performing one cycle consisting of inflowing aluminum precursor, purging, inflowing oxidizing agent and purging, once or plural times.

For another example, the aluminum oxide layer may be formed by performing one cycle consisting of inflowing zirconium precursor, inflowing aluminum precursor, purging, inflowing oxidizing agent and purging, once or plural times.

By the above process, the first insert layer structure 164 including two insert layers in the zirconium oxide layer may be formed.

In some example embodiments, as shown in FIG. 7, the first insert layer structure may be formed such that three or more insert layers are included in the zirconium oxide layer.

Referring to FIG. 17, a second dielectric layer 120b may be formed on the first insert layer structure 164 to form a dielectric layer structure 170. The dielectric layer structure 170 may be the same dielectric layer structure as shown in FIG. 6.

In some example embodiments, an upper interface layer may be further formed on the second dielectric layer 120b. Thus, a dielectric layer structure as shown in FIG. 8 may be formed.

In some example embodiments, a second insert layer structure and a third dielectric layer may be further formed on the second dielectric layer 120b. The second insert layer structure may be formed by substantially the same process for forming the first insert layer structure described with reference to FIG. 16. By the above process, a dielectric layer structure as shown in FIG. 9 may be formed. In some example embodiments, an upper interface layer may be further formed on the third dielectric layer, so that a dielectric layer structure as shown in FIG. 10 may be formed.

Thereafter, the upper electrode 150 may be formed on the dielectric layer structure 170.

In example embodiments, after forming the upper electrode 150, a heat treatment process may be further performed. The layers included in the dielectric layer structure 140 may be additionally crystallized by the heat treatment process.

Figure 19:
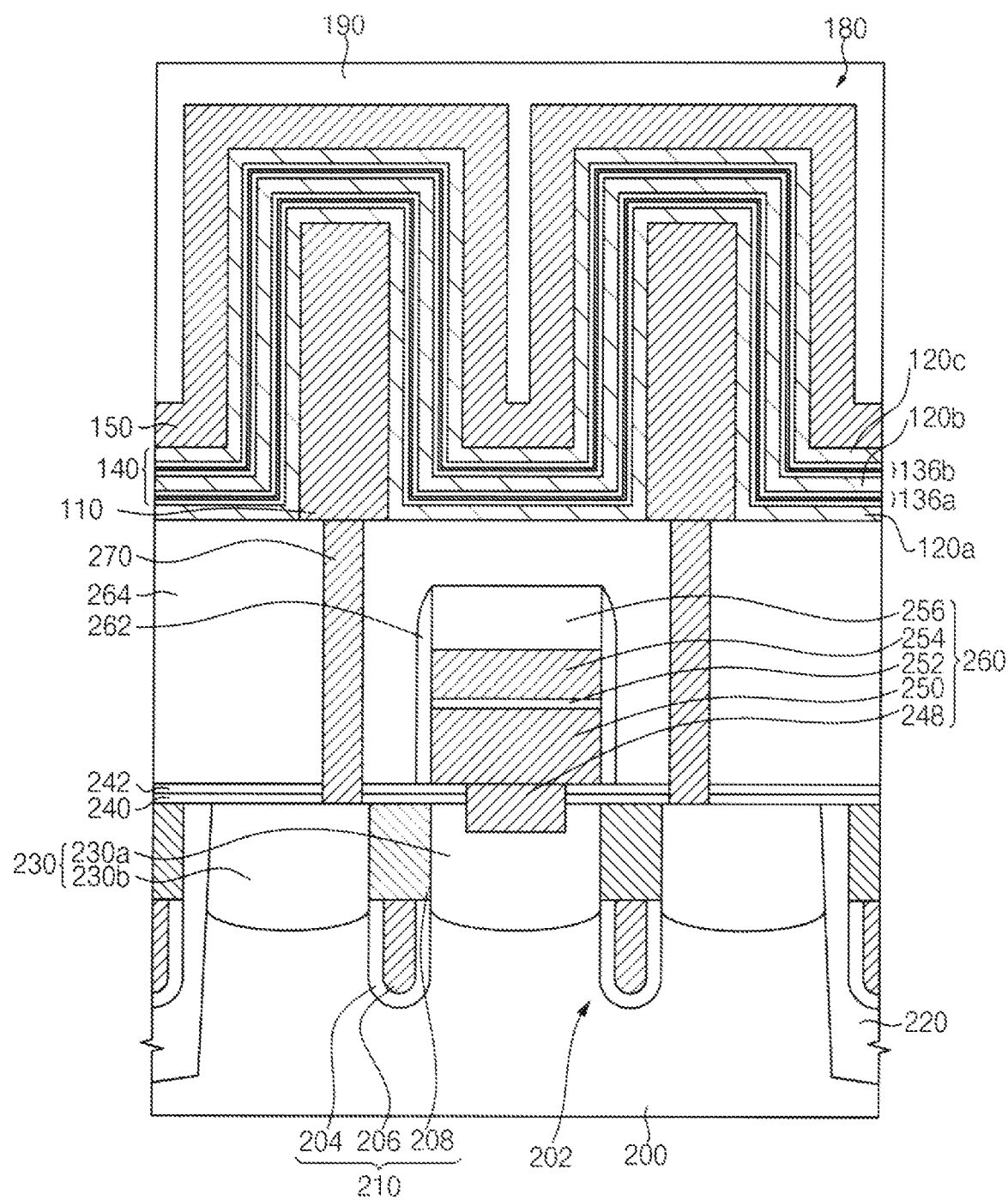

FIGS. 18 and 19 are a plan view and a cross-sectional view illustrating a DRAM device including a capacitor in accordance with example embodiments.

Although a DRAM memory device is disclosed in FIGS. 18 and 19, the capacitor according to example embodiments may be applied to all memory devices using a data storage unit.

FIG. 19 is a cross-sectional view taken along the line I-I' of FIG. 18.

Hereinafter, an extension direction of the gate structure may be referred to as a first direction, an extension direction of the bit line structure may be referred to as a second direction, and a length direction of the active region may be referred to as a third direction. The third direction may be an oblique direction having an angle with respect to the first direction.

Referring to FIGS. 18 and 19, the DRAM device includes a cell transistor, a capacitor 180, and a bit line structure 260 formed on a substrate 200. The DRAM device may include a unit cell including one cell transistor and one capacitor.

The substrate 200 may include an active region 201 and a field region. The field region may be a region in which an isolation layer 220 is formed in an isolation trench of the substrate 200. The active region 201 may be a region of the substrate other than the field region.

A gate trench 202 extending in the first direction parallel to an upper surface of the substrate 200 may be formed at an upper portion of the substrate 200. A gate structure 210 may be formed in the gate trench 202.

In example embodiments, the gate structure 210 may include a gate insulation layer 204, a gate electrode 206, and a capping insulation pattern 208. A plurality of the gate structures 210 may be arranged in a second direction parallel to the upper surface of the substrate 200 and perpendicular to the first direction.

The gate insulation layer 204 may include silicon oxide. The gate electrode 206 may include a metal material and/or polysilicon. The capping insulation pattern 208 may include silicon nitride.

An impurity region 230 serving as a source/drain region may be formed on an upper portion of the active region of the substrate 200 between the gate structures 210.

For example, the substrate 200 may include a first impurity region 230a electrically connected to the bit line structure 260 and a second impurity region 230b electrically connected to the capacitor 180.

A pad insulation pattern 240 and a first etch stop pattern 242 may be formed on the active region 201, the device isolation layer 220, and the gate structure 210. For example, the pad insulation pattern 240 may include an oxide such as silicon oxide, and the first etch stop pattern 242 may include a nitride such as silicon nitride.

A recess may be formed through the pad insulation pattern 240 and the first etch stop pattern 242 to expose a portion of the substrate 200 between the gate structures 210. An upper surface of the first impurity region 230a may be exposed on a bottom surface of the recess.

A first conductive pattern 248 may be formed in the recess. The first conductive pattern 248 may include, e.g., polysilicon doped with impurities. That is, the first conductive pattern 248 may contact the first impurity region 230a.

A second conductive pattern 250 may be stacked on the first conductive pattern 248. The second conductive pattern 250 may include, e.g., polysilicon doped with impurities. The first and second conductive patterns 248 and 250 may include substantially the same material, so that the first and second conductive patterns 248 and 250 may be merged into one conductive pattern. A barrier metal pattern 252, a metal pattern 254, and a hard mask pattern 256 may be stacked on the second conductive pattern 250.

A stacked structure of the first conductive pattern 248, the second conductive pattern 250, the barrier metal pattern 252, the metal pattern 254, and the hard mask pattern 256 may serve as a bit line structure 260.

For example, the first conductive pattern 248 may serve as a bit line contact, and the second conductive pattern 250, the barrier metal pattern 252, and the metal pattern 254 may serve as a bit line. The bit line structure 260 may extend in the second direction. A plurality of bit lines may arrange in the first direction.

In example embodiments, a spacer 262 may be formed on a sidewall of the bit line structure 260.

A first insulating interlayer 264 may be formed to fill a space between the bit line structures 260.

A contact plug 270 may be formed through the first insulating interlayer 264, the first etch stop pattern 242, and the pad insulating pattern 240. The contact plug 270 may contact the second impurity region 230b. The contact plug 270 may be between the bit line structures 260.

A capacitor 180 may be formed on the contact plug 270. The capacitor 180 may include a lower electrode 110, a dielectric layer structure 140, and an upper electrode 150.

The dielectric layer structure 140 may include dielectric layers 120a, 120b, and 120c and insert layer structures 136a and 136b between the dielectric layers 120a, 120b, and 120c. The insert layer structures 136a and 136b may include at least a first zirconium oxide layer, an insert layer and a second zirconium oxide layer sequentially stacked. The dielectric layer structure 140 may include plurality of insert layers spaced apart from each other.

In example embodiments, the dielectric layer structure 140 may have a first dielectric layer 120a, a first insert layer structure 136a, a second dielectric layer 120b, a second insert layer structure 136b and the third dielectric layer 120c sequentially stacked on an upper surface of the lower electrode 110. The capacitor shown in FIG. 19 may have the same structure as that described with reference to FIG. 1.

In some example embodiments, although not shown, the capacitor may have a structure of one of the capacitors described with reference to FIGS. 6 and 10.

A plate electrode 190 may be further formed on the upper electrode 150. The plate electrode 190 may include doped polysilicon.

In the DRAM device, the capacitor may have a high capacitance and low leakage currents. Thus, the DRAM device may have excellent electrical characteristics.

Comparative Experiment

A first sample of the capacitor according to the example embodiments may have a structure described with reference to FIG. 6. That is, as shown in FIG. 6, the capacitor according to the example embodiments may have a lower electrode 110, a dielectric layer structure 164, and an upper electrode 150 stacked. The dielectric layer structure 164 may include dielectric layers 120a and 120b and one insert layer structure 164. One insert layer structure may include two insert layers 162a and 162b spaced apart from each other. The dielectric layers 120a and 120b may be hafnium oxide layers. The insert layer structure 164 may include a first zirconium oxide layer, a first aluminum oxide layer, a second zirconium oxide layer, a second aluminum oxide layer, and a third zirconium oxide layer stacked.

Particularly, in the first sample of the capacitor according to the example embodiments, the dielectric layer structure may include a first hafnium oxide layer, the first zirconium oxide layer, the first aluminum oxide layer, the second zirconium oxide layer, the second aluminum oxide layer, the third zirconium oxide layer, and a second hafnium oxide layer stacked.

In a comparative sample of a capacitor for comparison with the example embodiments, a lower electrode, a dielectric layer structure, and an upper electrode may be stacked. The dielectric layer structure may include a first hafnium oxide layer, one aluminum oxide layer, and a second hafnium oxide layer stacked.

Figures 20, 21:
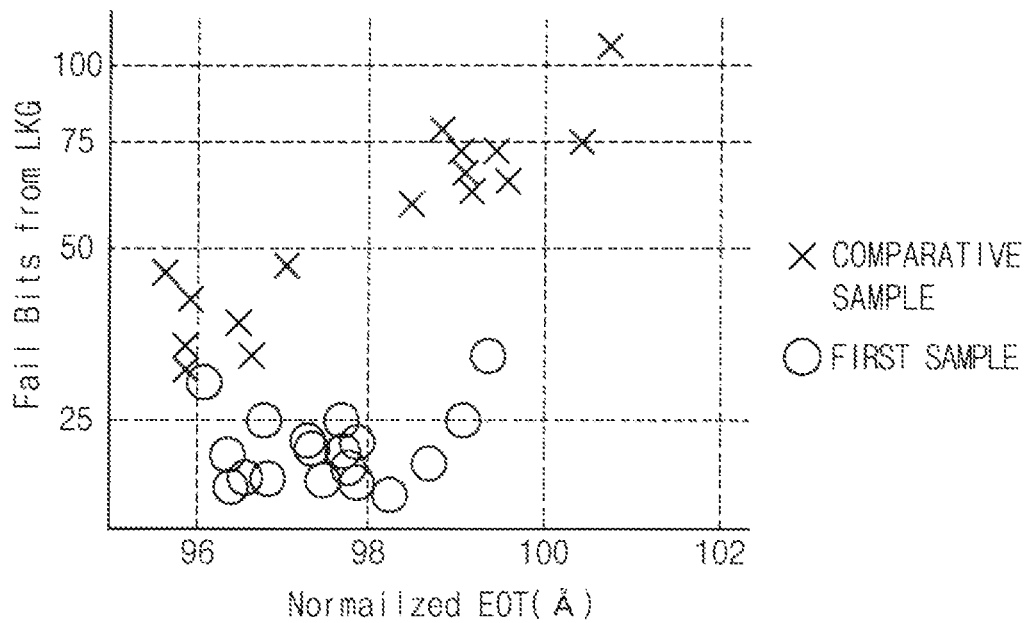

FIG. 20 shows the number of defects of leakage currents of thicknesses of each equivalent oxide layer in the first sample of the capacitor and the comparative sample of the capacitor according to the present invention.

Referring to FIG. 20, in thickness of same equivalent oxide layer, the number of defects of leakage currents of the first sample of the capacitor may be smaller than the number of defects of leakage currents of the comparative sample of the capacitor. Thus, in the capacitor according to the example embodiments, defects of leakage currents may decrease.

FIG. 21 is leakage currents values of thicknesses of each equivalent oxide layer in in a capacitor according to the example embodiments and a capacitor for comparison with the example embodiments.

A second sample of the capacitor according to the example embodiments may have a structure described with reference to FIG. 2. That is, as shown in FIG. 2, the capacitor according to the example embodiments may include a lower electrode 110, a dielectric layer structure 140, and an upper electrode 150 stacked. The dielectric layer structure 140 may include dielectric layers 120a, 120b, and 120c and two insert layer structures 136a and 136b. One insert layer structure may include one insert layer 132. The dielectric layers 120a, 120b, and 120c may be hafnium oxide layers. Each of the insert layer structures 136a and 136b may include a first zirconium oxide layer, a first aluminum oxide layer, and a second zirconium oxide layer stacked.

Particularly, in the second sample of the capacitor, the dielectric layer structure includes a first hafnium oxide layer, a first insert layer structure including the first zirconium oxide layer, the first aluminum oxide layer, and the second zirconium oxide layer, a second hafnium oxide layer, a second insert layer structure including, the first zirconium oxide layer, the first aluminum oxide layer, the second zirconium oxide layer, and a third hafnium oxide layer stacked.

The comparative sample of a capacitor may include a lower electrode, a dielectric layer structure, and an upper electrode stacked. The dielectric layer structure may include a first hafnium oxide layer, one aluminum oxide layer, and a second hafnium oxide layer stacked.

Referring to FIG. 21, when the second sample and the comparative sample have the same leakage currents, the second sample of the capacitor may have a small equivalent oxide layer thickness. That is, the capacitor according to the example embodiments may have a high capacitance and low target leakage currents by reducing the equivalent oxide layer thickness of the dielectric layer structure.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A capacitor, comprising:
a lower electrode;
a dielectric layer structure on the lower electrode, the dielectric layer structure comprising a plurality of dielectric layers and at least one insert layer structure between ones of the plurality of dielectric layers; and
an upper electrode on the dielectric layer structure,
wherein the at least one insert layer structure includes a plurality of zirconium oxide layers and at least two insert layers, and each of the at least two the insert layers is between ones of the plurality of zirconium oxide layers, wherein the insert layer structure comprising at least two insert layers is higher than a central portion in a vertical direction of the dielectric layer structure.

2. The capacitor of claim 1, wherein the at least two insert layers comprises a material selected from Al2O3, MgO, BeO, Y2O3, La2O3, CaO, and SiO2.

3. The capacitor of claim 1, wherein the dielectric layer structure has a thickness of 30 Å to 60 Å.

4. The capacitor according to claim 1, wherein a thickness of each of the at least two insert layers is less than a thickness of each zirconium oxide layer.

5. The capacitor of claim 1, wherein a sum of thicknesses of the at least two insert layers included in the dielectric layer structure is 1 Å to 3 Å.

6. The capacitor of claim 1, wherein each of the plurality of dielectric layers comprises at least one material selected from HfO2, ZrO2, TiO2, TaO2, and La2O3.

7. The capacitor of claim 1, wherein the dielectric layer structure further includes an upper interface layer between an uppermost dielectric layer and the upper electrode, and wherein the upper interface layer is a material selected from Al2O3, MgO, BeO, Y2O3, La2O3, CaO, and SiO2.

8. The capacitor of claim 1, wherein each of the plurality of dielectric layers comprises a hafnium oxide layer, and wherein the insert layer structure comprises a first zirconium oxide layer, an aluminum oxide layer, and a second zirconium oxide layer stacked sequentially.

9. The capacitor of claim 1, wherein the plurality of zirconium oxide layers directly contacts the at least two insert layers.

10. A capacitor, comprising:
a lower electrode;
a dielectric layer structure on the lower electrode, the dielectric layer structure including a plurality of dielectric layers and a single insert layer structure between ones of the plurality of dielectric layers; and
an upper electrode on the dielectric layer structure;
wherein the single insert layer structure includes at least a first zirconium oxide layer, an aluminum oxide layer, and a second zirconium oxide layer stacked sequentially,
wherein the dielectric layer structure includes a plurality of aluminum oxide layers,
wherein the single insert layer structure includes the plurality of aluminum oxide layers spaced apart from each other and the single insert layer structure comprising the plurality of aluminum oxide layers is higher than a central portion in a vertical direction of the dielectric layer structure, and
wherein a thickness of each of the plurality of aluminum oxide layers is less than a thickness of the first zirconium oxide layer and the second zirconium oxide layer and a sum of thicknesses of the aluminum oxide layers in the dielectric layer structure is 1 Å to 3 Å.

11. The capacitor of claim 10, wherein each of the plurality of dielectric layers include at least one material selected from HfO2, ZrO2, TiO2, TaO2, and La2O3.

12. The capacitor of claim 10, wherein the dielectric layer structure further includes an upper interface layer between an uppermost dielectric layer and the upper electrode.

13. The capacitor of claim 10, wherein the first zirconium oxide layer and the second zirconium oxide layer directly contact the aluminum oxide layer.

14. A DRAM device, comprising:
a cell transistor on a substrate, the cell transistor including a gate structure, a first impurity region, and a second impurity region;
a bit line structure electrically connected to the first impurity region;
a capacitor on the bit line structure, the capacitor electrically connected to the second impurity region,
wherein the capacitor comprises:
a lower electrode;
a dielectric layer structure on the lower electrode, the dielectric layer structure including a plurality of dielectric layers and at least one insert layer structure between ones of the plurality of dielectric layers, the dielectric layer structure having a thickness of 30 Å to 60 Å; and
an upper electrode on the dielectric layer structure,
wherein the at least one insert layer structure comprises at least a first zirconium oxide layer, an aluminum oxide layer, and a second zirconium oxide layer stacked sequentially, and
wherein the dielectric layer structure includes a plurality of aluminum oxide layers,
wherein the at least one insert layer structure comprises a single insert layer structure in the dielectric layer structure, and wherein the single insert layer structure includes the plurality of aluminum oxide layers spaced apart from each other and the single insert layer structure comprising the plurality of aluminum oxide layers is higher than a central portion in a vertical direction of the dielectric layer structure.

15. The DRAM device of claim 14, wherein a sum of thicknesses of aluminum oxide layers included in the insert layer structure is 1 Å to 3 Å.

16. The DRAM device of claim 14, wherein the first zirconium oxide layer and the second zirconium oxide layer directly contact the aluminum oxide layer.

* * * * *